United States Patent
Jahnke et al.

(10) Patent No.: US 8,924,907 B1
(45) Date of Patent: Dec. 30, 2014

(54) BITSTREAM VERIFICATION ON EMBEDDED PROCESSOR—FPGA PLATFORM

(71) Applicant: Altera Corporation, San Jose, CA (US)

(72) Inventors: Steve Jahnke, Allen, TX (US); Yves Vandervennet, Austin, TX (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/089,596

(22) Filed: Nov. 25, 2013

(51) Int. Cl.
*G06F 17/50* (2006.01)

(52) U.S. Cl.
CPC .................................. *G06F 17/5054* (2013.01)
USPC .......................................... 716/117; 716/116

(58) Field of Classification Search
CPC ............ G06F 17/5054; G06F 17/5045; G06F 17/5072; G06F 17/5027; G06F 17/505; G06F 15/7867; H03K 17/177
USPC .................................................. 716/116, 117
See application file for complete search history.

(56) References Cited

U.S. PATENT DOCUMENTS

| | | | |
|---|---|---|---|
| 7,127,697 B1 * | 10/2006 | Wells et al. | 716/106 |
| 7,979,827 B1 * | 7/2011 | Trimberger et al. | 716/117 |
| 2013/0246897 A1 * | 9/2013 | O'Donnell | 715/205 |

* cited by examiner

*Primary Examiner* — Vuthe Siek
(74) *Attorney, Agent, or Firm* — Weaver Austin Villeneuve & Sampson LLP

(57) ABSTRACT

Various embodiments of the present disclosure provide techniques for verifying compatibility between a configuration image file bitstream for a programmable logic device (PLD) and an electrical circuit incorporating the PLD. The circuit includes an embedded processor, at least one memory device, and at least one input/output (I/O) device. A computer processing arrangement receives a user selection of the target image file, a first identifier of a first set of electrical circuit designs with which the target image file is compatible; and makes a determination whether or not the first circuit has a design included in the first set by comparing the first identifier with a second identifier, the second identifier corresponding to a design definition of the circuit.

20 Claims, 7 Drawing Sheets

US 8,924,907 B1

BITSTREAM VERIFICATION ON EMBEDDED PROCESSOR—FPGA PLATFORM

TECHNICAL FIELD

The present disclosure generally relates to integrated circuits and, more particularly, to techniques for verifying compatibility between a configuration image file bitstream for a programmable logic device (PLD) and an electrical circuit including the PLD and an embedded processor.

BACKGROUND

A PLD is a semiconductor integrated circuit that contains logic circuitry that can be programmed to perform a host of logic functions. Such programming may be accomplished by loading onto the PLD a configuration image file (or "bitstream").

An example of a PLD that may benefit from the presently disclosed techniques include a field programmable gate array (FPGA) and, particularly an FPGA integrated in a higher level assembly such as an electrical circuit that includes an embedded processor and various hardware and software elements in addition to the FPGA.

On such a higher level assembly, it is desirable to facilitate loading a configuration image file bitstream previously designed by a first party onto the FPGA by a second party who may be unrelated to the first party. For example, a developer of the electrical circuit, or a product incorporating the circuit, may wish to load an FPGA configuration image file prepared by an unrelated FPGA designer. Such an FPGA configuration image file may be referred to as a "target image file". The target image file may be available for downloading over the Internet, for example onto the FPGA device and may have been prepared to be compatible with a discrete number of different electrical circuit designs.

The circuit developer, however, may be unable to efficiently or reliably verify whether the target image file is compatible with the specific electrical circuit design within which the developer intends the target image file to operate.

Computer-aided design tools exist to facilitate design of a custom configuration image file to be implemented on a PLD. However, existing tools have limited abilities to assist the design of a higher level assembly electrical circuit, particularly where it is desired to use a previously prepared configuration image file.

Improved techniques for assuring compatibility between electrical circuits incorporating PLDs, embedded processors, and other hardware and software components, on the one hand, and a target configuration image file, on the other, are therefore desirable.

SUMMARY OF INVENTION

The presently disclosed techniques relate to verifying compatibility between a configuration image file bitstream for a programmable logic device (PLD) and a hardware component incorporating the PLD.

In some implementations, the hardware component is an electrical circuit incorporating the PLD. The circuit includes an embedded processor, at least one memory device, and at least one input/output (I/O) device. A computer processing arrangement receives a user selection of the target image file, a first identifier of a first set of electrical circuit designs with which the target image file is compatible; and makes a determination whether or not the first circuit has a design included in the first set by comparing the first identifier with a second identifier, the second identifier corresponding to a design definition of the circuit.

In some implementations, a design tool generates a configuration image file for programming one or more programmable logic devices (PLD's). The design tool is configured to create, responsive to an input from a first user, a first identifier of a first set of electrical circuit designs with which the configuration image file is compatible, each electrical circuit design within the set being defined by parameters of, at least (i) a respective PLD, (ii) an embedded processor external to and communicatively coupled with the respective PLD, (iii) a memory device external to the respective PLD, and (iv) an input/output (I/O) device. The design tool makes the first identifier, together with the configuration image file, available to a second party other than the first user These and other features will be presented in more detail in the following specification of the invention and the accompanying figures, which illustrate by way of example the principles of the invention.

BRIEF DESCRIPTION OF THE DRAWINGS

The included drawings are for illustrative purposes and serve only to provide examples of possible implementations of the disclosed inventive techniques. These drawings in no way limit any changes in form and detail that may be made by one skilled in the art without departing from the spirit and scope of the disclosed implementations.

Figure 1:
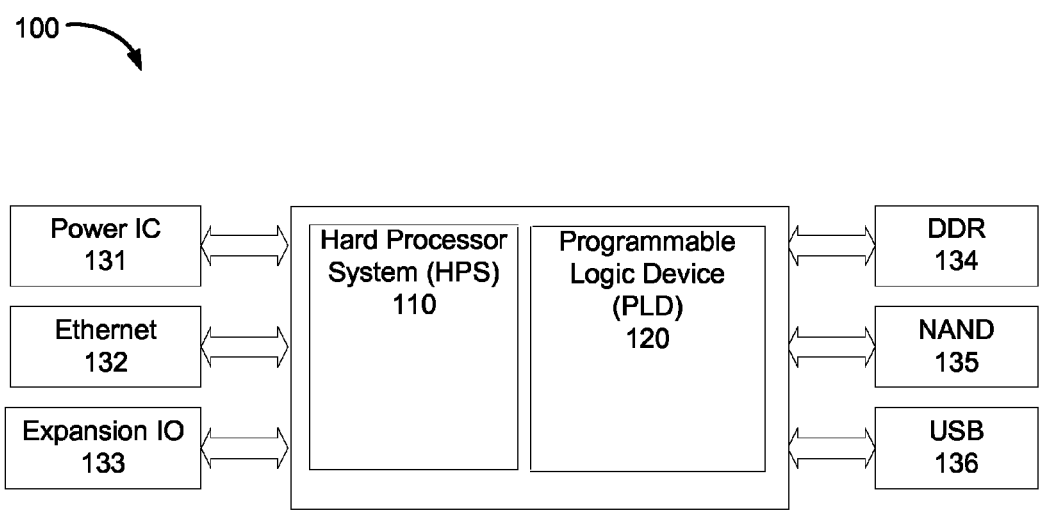
FIG. 1 is a block diagram of an example electrical circuit design including a PLD and an embedded processor.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the disclosed subject matter, as defined by the appended claims.

DETAILED DESCRIPTION

Reference will now be made in detail to embodiments of the present invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments may include multiple iterations of a technique or multiple instantiations of a device unless noted otherwise. For example, a system may use a processor in a variety of contexts. However, it will be appreciated that a system can use multiple processors while remaining within the scope of the present invention unless otherwise noted.

Furthermore, the techniques and mechanisms of the present invention will sometimes describe a coupling between two entities. It should be noted that a coupling between two entities does not necessarily mean a direct, unimpeded connection, as a variety of other entities may reside between the two entities. For example, a processor may be coupled with a memory component, but it will be appreciated that a variety of bridges and controllers may reside between the processor and memory.

As used herein, and in the claims, the term "PLD" means a programmable logic device such as, for example, an FPGA or any other programmable hardware on a chip. In particular implementations described hereinbelow, a portion of the chip may be configured to be retargetable to perform a new hardware function that requires a driver to be tied to it.

The embodiments described herein relate to structures and methods for verifying compatibility between a configuration image file (which may be referred to as a "bitstream") for programming a PLD and an electrical circuit incorporating or associated with the PLD. The electrical circuit (which may also be referred to as the "board") may include, for example, in addition to the PLD, a hard processor system (HPS) including an embedded processor, at least one memory device, and at least one input/output (I/O) device. An example of an electrical circuit contemplated for use with the presently disclosed techniques is illustrated in FIG. 1. In the illustrated implementation, arrangement 100 includes an HPS 110 integrated with PLD 120 HPS 110 may be connected with PLD 120 by way of a high-bandwidth interconnect backbone. HPS 110 may include a dual-core ARM Cortex-A9 MPCore processor, for example. PLD 120 may also be referred to as an FPGA fabric. Arrangement 100 may also include a number of peripherals including memory, I/O devices and/or drivers. For example, in the illustrated implementation, the identified peripherals include Power IC 131, Ethernet 132, Expansion IO 133, DDR 134, NAND 135, and USB 136.

One or more of the embedded processor, memory device and I/O device may be coupled with the PLD. The electrical circuit may be realized as multiple components on, for example, a board or a die or may include a hybrid IC package, an interposer, or a 3D package. In some implementations, the embedded processor may, together with the PLD, be packaged as a system on a chip (SOC).

It will be appreciated that the electrical circuit will generally include various hardware and software components with which the PLD, once programmed with the bitstream, must be compatible. "Compatible", as the term is used herein and in the claims, means that the PLD, once programmed with the bitstream will operate properly with the various hardware and software components of the circuit. For example, a bitstream compatible with a particular electrical circuit design will cause the PLD to comply with the interface requirements of the embedded processor, memory and I/O devices of that particular electrical circuit design As a further example, a bitstream compatible with a particular electrical circuit design will cause the PLD to be operable with, and comply with the interface requirements of, other connected components, such as power management components, external memory, and mass storage devices such as a secure digital card, or NAND memory.

A developer of a board may wish to program the PLD with a configuration image file previously designed by a PLD designer. The PLD designer may be unrelated to the board developer. Such a previously designed configuration image file may be referred to as a "target image file" or "target bitstream". The target bit stream may be available for downloading over the Internet, for example, onto the PLD. The target bit stream may have been intended by the PLD designer to be compatible with a discrete number of PLDs in combination with certain specific electrical circuit designs.

In some implementations, a unique identifier ("bitstream identifier") is associated with the target bitstream. Advantageously, the target bitstream may be assigned the bitstream identifier at design time by, for example, a configuration image file design tool. The bitstream identifier may include a hash of the target bitstream, such as an SHA-1 hash or other cryptographic or non-cryptographic hash identifier. Advantageously, the assigned bitstream identifier unambiguously relates to the specific associated configuration image file, including revision number and/or release date, for example. In some implementations, the bitstream identifier may include a list of board designs with which the target bitstream is intended to be compatible.

Advantageously, a database file may be maintained that correlates the bitstream identifier with one or more board designs with which the bitstream is compatible. For example, the database file may correlate, for a number of target image files, a number of board designs that are supported by each FPGA bitstream. In some implementations, a bitstream identifier associated with each target image file may indicate one or more board designs compatible with the target image file. In some implementations, an initial identification of the board designs with which a target image file is intended to be compatible may be made at design time by the configuration image file designer.

Prior to loading target image file onto the FPGA, the bitstream identifier associated with the target image file may be read (either as part of the target image file, or as part of a larger container format) and checked against the database file. For example, where the bitstream identifier is a hashtag, a computer processing arrangement, which may be an embedded processor on the board, for example, may read the hashtag and check it against the database file prior to permitting the bitstream to be loaded onto the FPGA. In some implementations, the database file may be stored locally on, for example the embedded processor of the board, or other local computer processing arrangement. Alternatively, or in addition, the database file may be stored remotely and be accessed over the Internet, for example. Accessing the local or remote data base file may, in some implementations, be a process that is initiated automatically each time a process of loading a configuration image file onto the FPGA is initiated.

If the database file indicates compatibility between the target image file and the board, a SUCCESS flag may be set and the bitstream may be loaded. Otherwise, an ERROR may be generated and/or loading of the bitstream may be prevented.

In some implementations, the database may be updated, manually or automatically. In the latter case, for example, the database may be updated automatically through board design information that is already loaded on the server where bit streams are created. For example, where an FPGA designer uses a web based design tool, the design tool may collect compatibility data from the designer and use the collected data to update the database file.

Figure 2:
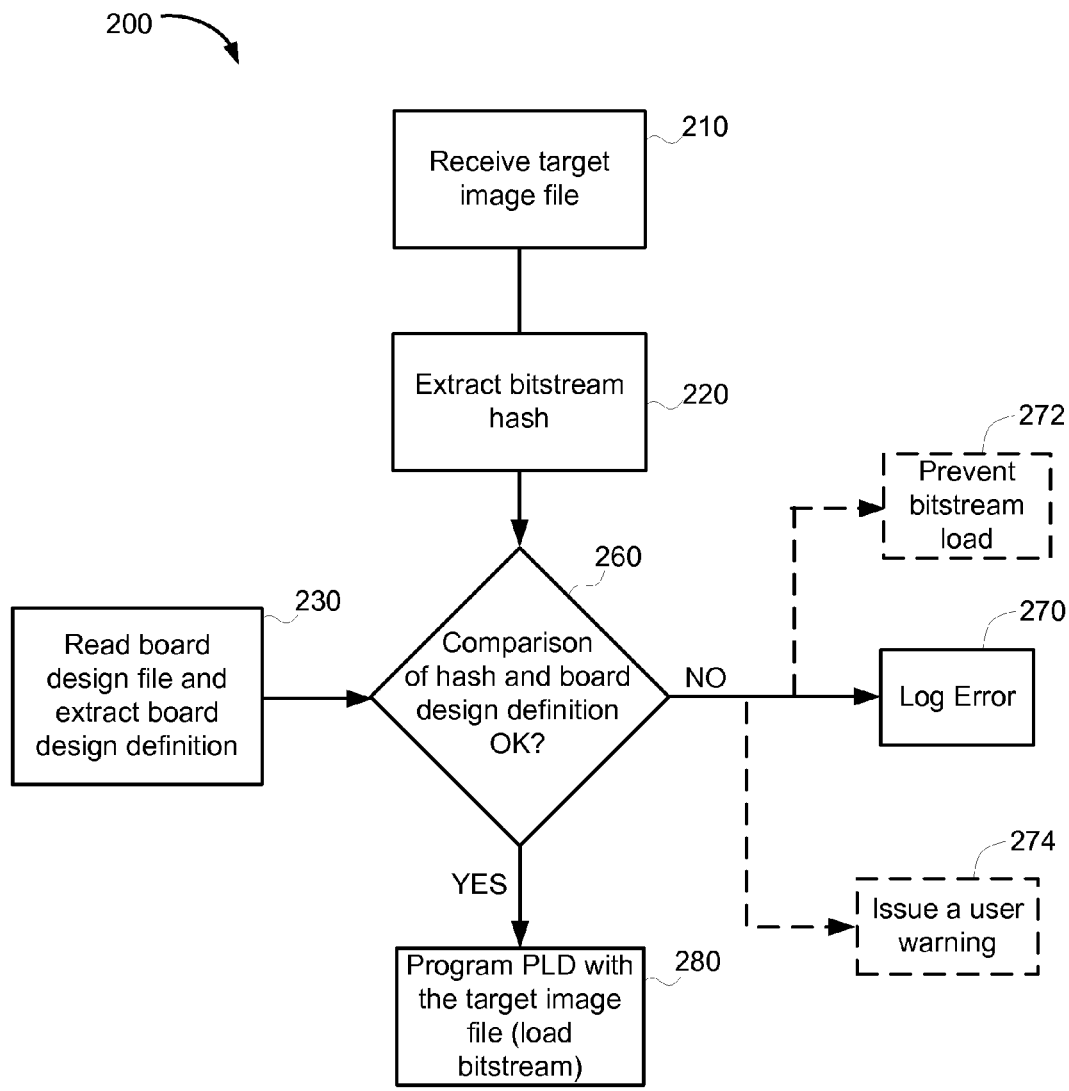
FIG. 2 is a logic block diagram illustrating an implementation of the presently disclosed techniques.

A better understanding of the presently disclosed structures and techniques may be obtained by referring first to FIG. 2, which illustrates an example of a conceptual flow diagram for verifying whether a target image file is compatible with a programmable logic device (PLD) incorporated within an electrical circuit. In the illustrated method 200, a target image file is received at step 210. The target image file may be a target configuration image file that a developer of an electrical circuit, or board, may desire to use to program an FPGA that is a component of the board. The received target image file may be loaded into a memory device. The memory device may be a memory component on the board, or be associated with a computer processing arrangement associated with the board or the board developer. For example, the memory device may be part of a board development tool. In some implementations, the memory may be part of or communicatively coupled to an embedded processor on the board. The embedded processor may, together with the PLD, be packaged as an SOC.

At step 220, the bitstream identifier associated with the target image file may be determined. For example, a hash related to the bitstream identifier may be extracted. The bitstream identifier may specify a first set of electrical circuit designs with which the target image file is intended to be compatible. In some implementations, the hash may be extracted by the embedded processor or another computer processing arrangement. For example the hash may be extracted by a computer processing arrangement associated with the board development tool.

At step 230, a board design definition may be extracted. The board design definition may include board part number and revision number and specific design features of the board. Advantageously, the board design definition may include an unambiguous identification of the board's embedded processor, memory device and I/O devices. In some implementations, the board design definition may include a list of drivers, and characteristics of the drivers. Advantageously, the design definition may identify, directly or by reference, all electrical interfaces between the PLD and other board components.

In some implementations, the embedded processor or other computer processing arrangement may extract the board design definition by accessing a board design definition file that defines the above mentioned parameters of the board.

At step 260, a compatibility check may be made between the bitstream identifier and the extracted board design definition. In some implementations, the compatibility check may include making a comparison between information associated with the bitstream identifier and the extracted board design definition. The compatibility check may be made by the embedded processor or other computer processing arrangement. If the compatibility check indicates the bitstream is compatible with the board, the process may proceed to step 280 and the bitstream may be loaded onto the PLD. On the other hand, if the compatibility check does not indicate the bitstream is compatible with the board, the process may proceed to step 270 and log an error instead of proceeding to step 280. Alternatively, or in addition, the process may include a step 272 of preventing an attempt to load the bitstream and/or a step 274 of warning a user of risks that may be associated with loading the bitstream. Step 274, in some implementations, may include outputting a warning message to user such as, for example, "WARNING: incompatible bitstream—undefined behavior may result".

Figure 3:
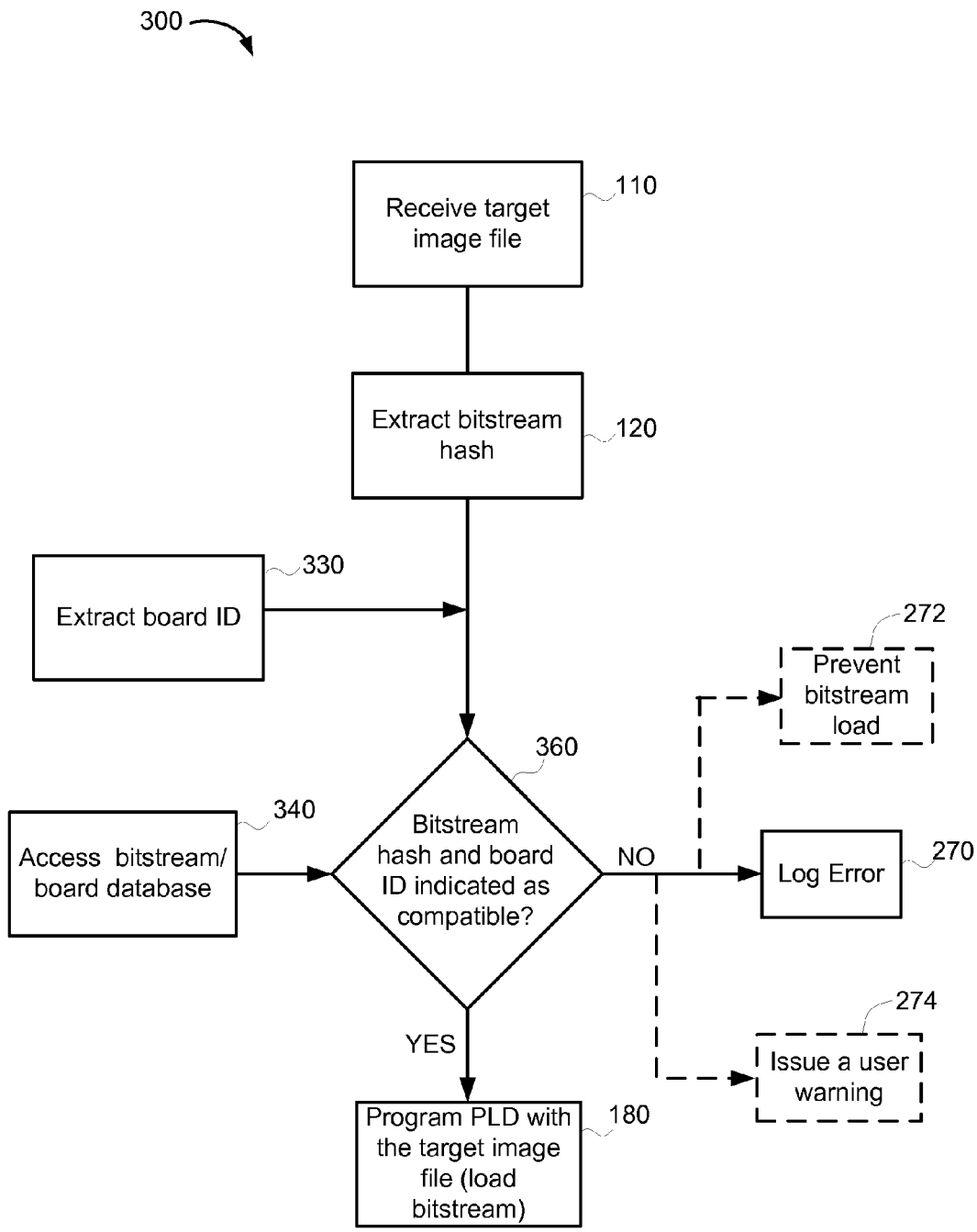
FIG. 3 is a logic block diagram illustrating another implementation of the presently disclosed techniques.

FIG. 3 illustrates a further example of a conceptual flow diagram for verifying whether a target image file is compatible with a programmable logic device (PLD) incorporated within an electrical circuit. In the illustrated method 300, a target image file is received at step 210, and a bitstream identifier associated with the target image file is determined at step 220, as described hereinabove. At step 330 a board identifier may be extracted. For example the embedded processor or other computer processing arrangement may extract a board model number, design revision number, and/or serial number for example.

At step 340, a database file may be accessed. For example, the embedded processor or other computer processing arrangement may access a remotely or locally stored database file that includes lists of known bitstream identifiers and board identifiers. Advantageously, the database may indicate, for each of a number of bitstream identifiers, the board identifiers with which the bitstream is compatible. The database may be accessible over the Internet, i.e., be "cloud-based". In some implementations, the database may be at least partially populated and maintained by a computer assisted bitstream design tool. For example, during a bitstream design process, the design tool may request a designer of the bitstream to indicate board compatibility specifications. The design tool, which may also be cloud-based, may use this information to automatically update the database. Optionally, parts or all of the bitstream/board database may be stored locally.

At step 360, a compatibility check may be made between the extracted board ID and the bitstream identifier. In some implementations, the compatibility check may include making a comparison between the extracted board ID and the bitstream identifier with information contained in the bitstream/board database, to determine whether the database indicates the bitstream and board are compatible. The compatibility check may be made by the embedded processor or other computer processing arrangement.

If the compatibility check indicates the bitstream is compatible with the board, the process may proceed to step 280 and the bitstream may be loaded onto the PLD, as described hereinabove. On the other hand, if the comparison does not indicate the bitstream is compatible with the board, the process may proceed to step 270 and log an error instead of proceeding to step 280. Alternatively, or in addition, the process may include a step 272 of preventing an attempt to load the bitstream and/or a step 274 of warning a user of risks that may be associated with loading the bitstream.

It will be appreciated that the presently disclosed techniques facilitate design of complex boards such as those incorporating both a PLD and an embedded processor (whether or not configured together as an SOC) as well as diverse memory and I/O devices. In the absence of the presently disclosed techniques, unless a developer of such a board was also in control of designing the PLD configuration image file, the board developer would have little reason for confidence that a PLD programmed with a pre-built configuration image file would be compatible with the developer's board. This is particularly problematic, because the board developer will not generally have the particular skillset necessary to evaluate, still less design, a PLD configuration image file.

Figure 4:
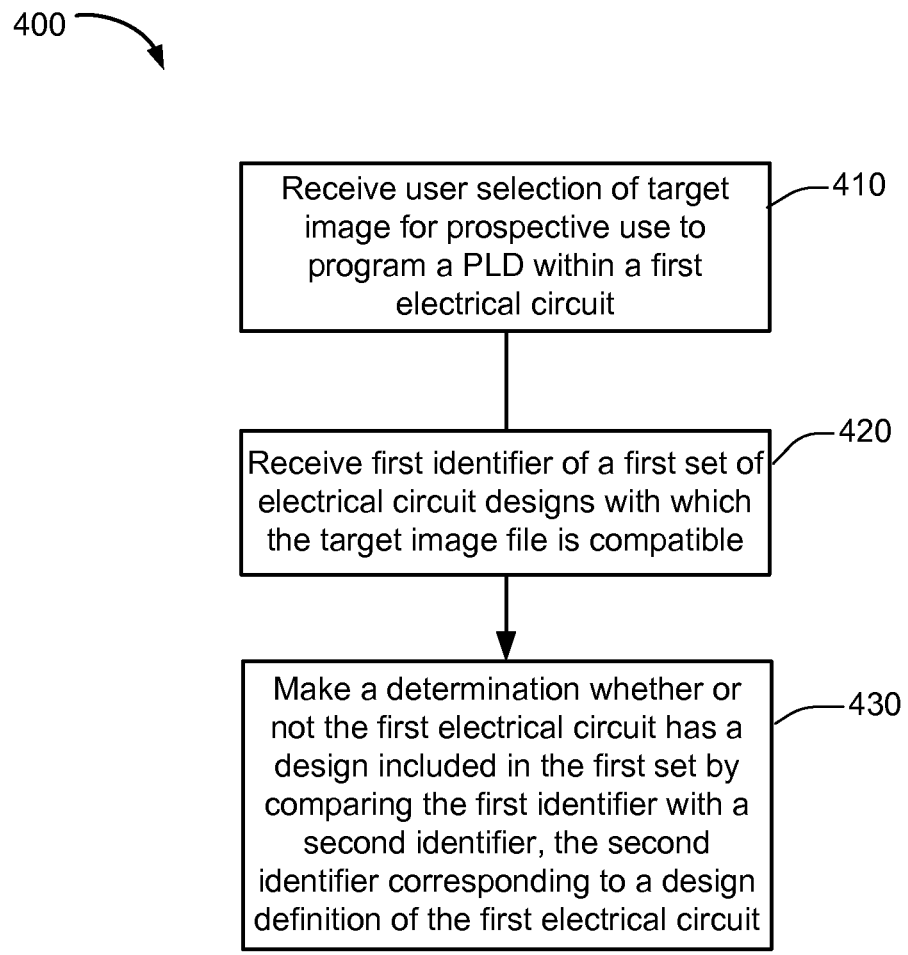
FIG. 4 is a process flow diagram illustrating an implementation of the presently disclosed techniques.

Referring now to FIG. 4, a process flow diagram is illustrated of a method 400 for verifying whether a target configuration image file is compatible with a PLD, in accordance with one embodiment. The method 400 may begin at step 410 by receiving a user selection of a target image for prospective use to program a PLD within an electrical circuit. As indicated hereinabove, the electrical circuit, or board, may include the PLD, an embedded processor, and various memory and I/O devices.

At step 420, a first identifier of a first set of electrical circuit designs with which the target image file is compatible may be received. As indicated hereinabove, the electrical circuit may include, for example, in addition to the PLD, an embedded processor, at least one memory device, and at least one input/output (I/O) device. One or more of the embedded processor, memory device and I/O device may be coupled with the PLD. The electrical circuit may be realized as multiple components on, for example, a board or a die or may include a hybrid IC package, an interposer, or a 3D package. In some implementations, the embedded processor may, together with the PLD, be packaged as a system on a chip (SOC). The first identifier, or information with which the first identifier may be determined, may be included in the target image file. In some implementations, the first identifier may, for example, be a hashtag associated with, or incorporated within, the bitstream. The target image file may be received by a computer processing arrangement that may be located on or off the board. If on the board, the computer processing arrangement may be included in the embedded processor, or be embodied in a separate device. In some embodiments, the computer processing arrangement may be off the board, and be incorporated in a design tool or other type of board developer work station, for example.

At step 430, a determination may be made as to whether or not the first electrical circuit has a design included in the first set by comparing the first identifier with a second identifier, the second identifier corresponding to a design definition of the first electrical circuit. The determination may be made by the computer processing arrangement. As indicated above, the computer processing arrangement may be located on or off the board. In some implementations, the second identifier may be a hashtag, for example.

Figure 5:
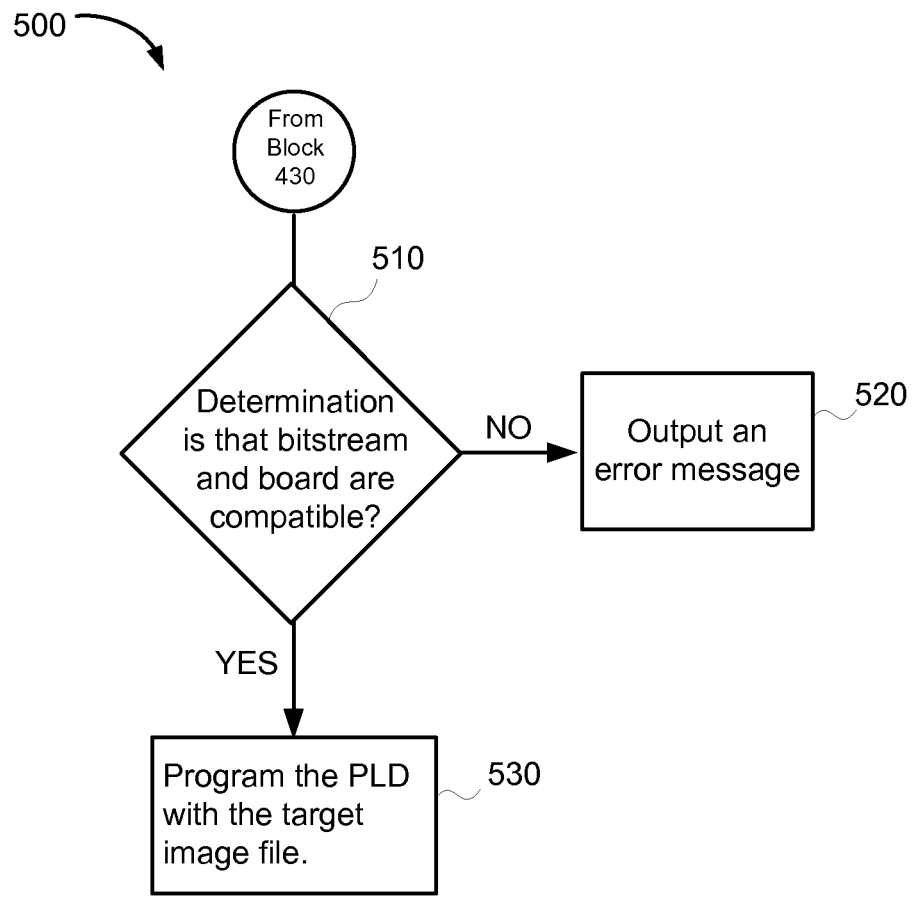
FIG. 5 is a logic block diagram illustrating a further implementation of the presently disclosed techniques

Referring now to FIG. 5, in some implementations, subsequent to making a determination as to whether or not the first electrical circuit has a design included in the first set, the illustrated process flow 500 may be executed. In the illustrated implementation, according to a decision made at step 510, if the determination at step 430 is that the bitstream and board are compatible, the process will proceed to step 530 and program the PLD with the target image file. On the other hand, if the determination at step 430 is that the bitstream and board are not compatible, an error message may be outputted. Moreover, in some implementations programming of the PLD with the target image file may be prevented, and/or a warning message may be output to the user.

Figure 6:
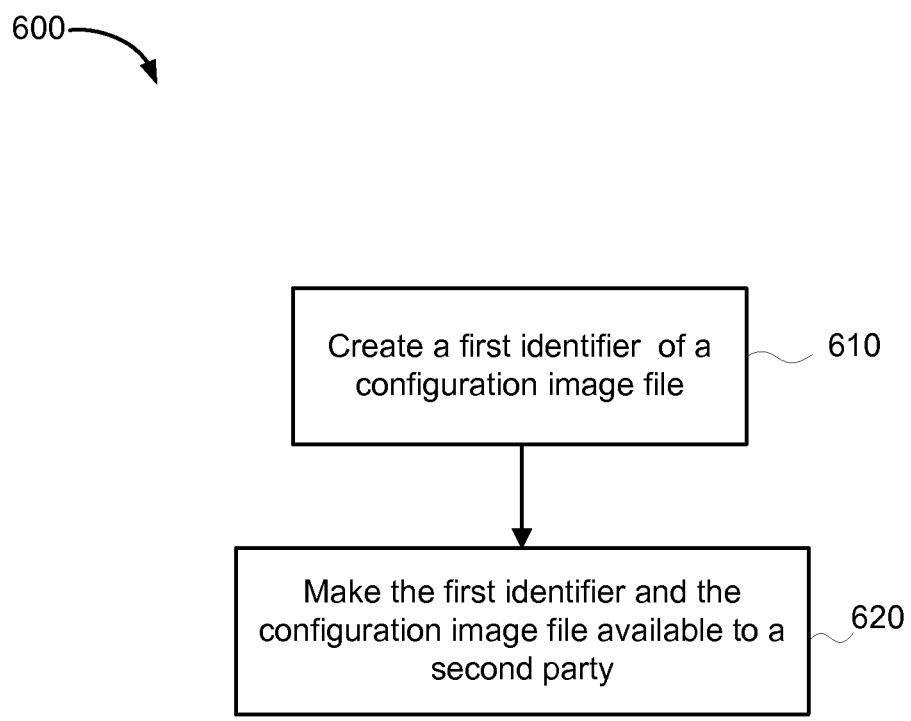
FIG. 6 is a process flow diagram illustrating another implementation.

Referring now to FIG. 6, a process flow diagram for generating a configuration image file configured for programming one or more PLD's is illustrated. Method 600 may begin at step 610 by creating a first identifier of a configuration image file for programming a PLD. Advantageously, the first configuration image file may have been created by a first user of a design tool. The design tool may be or include a computer assisted design tool or work environment with which the user interacts to create a PLD image file. In some implementations, the design tool may be accessed over the internet, i.e., be cloud-based. Advantageously the design tool may generate the identifier and store the identifier in a database, together with the image file. The first identifier may be, for example, a hashtag.

In some implementations the design tool may be configured to create the first identifier of the first set of electrical circuit designs with which the configuration image file is compatible. Each electrical circuit design within the set may be defined by parameters of (i) a respective PLD, (ii) an embedded processor external to and communicatively coupled with the respective PLD, (iii) at least one memory device external to the respective PLD, and (iv) at least one input/output (I/O) device.

Referring still to FIG. 6, at step 620 the first identifier and the configuration image file may be made available to a second party. The second party may be, for example, a developer of an electrical circuit, including a PLD, and may have no connection with the first user. In some implementations, making the first identifier and the configuration image file available to the second party may include uploading the first identifier and the configuration image file to a database accessible to the second party.

Figure 7:
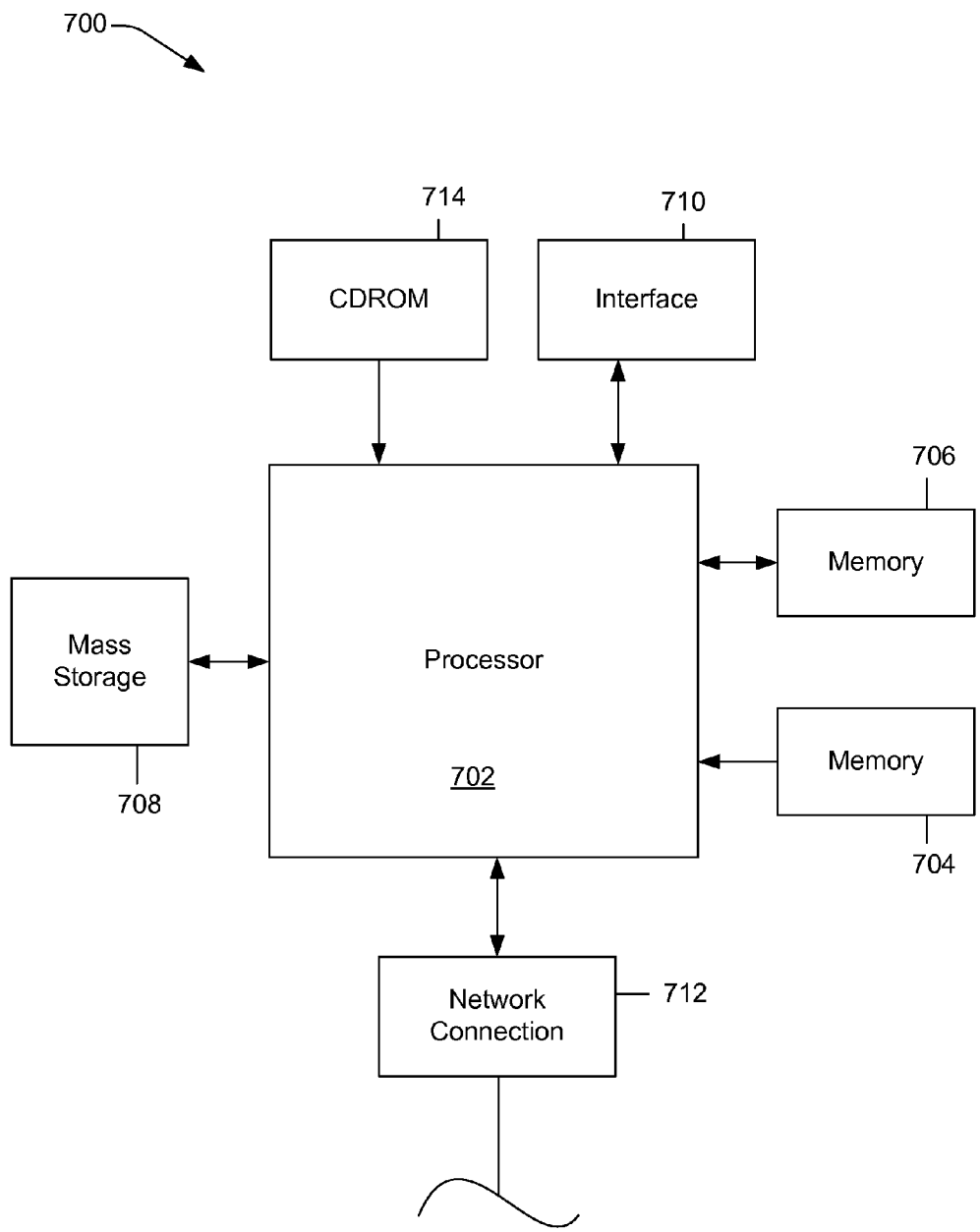
FIG. 7 illustrates an example of a computer system configurable as a design tool, in accordance with one implementation.

Referring now to FIG. 7, an example of a computer system configurable as a design tool is illustrated, in accordance with one implementation. The computer system 700 includes any number of processors 702 (also referred to as central processing units, or CPUs) that are coupled to devices including memory component 706 (typically a random access memory, or "RAM") and memory component 704 (typically a read only memory, or "ROM").

Memory components 702 and 704 may include any suitable type of the computer-readable media described above. A mass storage device 708 may also be coupled to CPU 702 to provide additional data storage capacity and may include any of the computer-readable media described above. The mass storage device 708 may be used to hold a library or database of prepackaged logic or intellectual property functions, as well as information on generating particular configuration image files. It will be appreciated that the information retained within the mass storage device 708, may, in appropriate cases, be incorporated in standard fashion as part of memory component 706 as virtual memory. A specific mass storage device such as a CD-ROM 714 may also pass data uni-directionally to the CPU.

CPU 702 may be coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other input devices such as, of course, other computers. The CPU 702 may be a design tool processor. Finally, CPU 702 optionally may, advantageously, be coupled to a computer or telecommunications network using a network connection as shown generally at 712. With such a network connection, it is contemplated that CPU 702 might receive information from the network, or might output information to the network in the course of performing the above-described process steps. More particularly, CPU 702 may be enabled to access "cloud-based" remote data bases of, for example, PLD module designs and PLD module driver software. It should be noted that the system 700 might also be associated with devices for transferring completed designs onto a programmable chip.

The presently disclosed techniques cause a target bitstream to be checked not only for FPGA type but also to make sure it is suitable for the board of which the PLD is a component. Consequently, a PLD incorporated into a complex electrical circuit may be enabled to appear to the circuit developer much like any standard, fixed logic device. As a result, PLDs may be used by circuit and software developers who have no particular PLD expertise and who may not have access to PLD build tools, or desire, ability or time to learn how to build a PLD bitstream.

Although many of the components and processes are described above in the singular for convenience, it will be appreciated by one of skill in the art that multiple components and repeated processes can also be used to practice the techniques of the present invention.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, a data processing apparatus.

If implemented in software, the functions may be stored as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may be non-transitory and may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Thus, improved automated techniques for verifying compatibility between a configuration image file for a programmable logic device (PLD) and an electrical circuit including the PLD and an embedded processor have been disclosed.

Although the foregoing systems and methods have been described in detail by way of illustration and example for purposes of clarity and understanding, it will be recognized that the above described systems and methods may be embodied in numerous other variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. A method comprising:
receiving, with a computer processing arrangement, a user selection of a target configuration image file; and, with the computer processing arrangement:
making a verification whether the target configuration image file is compatible with an electrical circuit, the electrical circuit comprising a programmable logic device (PLD), an embedded processor external to and communicatively coupled with the PLD, at least one memory device, and at least one input/output (I/O) device, wherein making the verification comprises:
receiving a first identifier, the first identifier comprising identification information of a first set of electrical circuit designs with which the target configuration image file is compatible; and
making a determination whether the electrical circuit has a design included in the first set by comparing the first identifier with a second identifier, the second identifier corresponding to a design definition of the electrical circuit.

2. The method of claim 1, wherein one or both of the first identifier and the second identifier is a hashtag.

3. The method of claim 1, wherein the electrical circuit includes the computer processing arrangement.

4. The method of claim 1 wherein the embedded processor includes the computer processing arrangement.

5. The method of claim 1, further comprising, after receiving the user selection and before making the determination, downloading the target configuration image file onto the at least one memory device.

6. The method of claim 1, further comprising, when the determination is that the electrical circuit has a design included in the set of electrical circuit designs, programming the PLD with the target configuration image file.

7. The method of claim 1, further comprising, when the determination is that the electrical circuit has a design not included in the set of electrical circuit designs, outputting an error message.

8. The method of claim 7, further comprising preventing programming of the PLD with the target configuration image file.

9. The method of claim 1, wherein the PLD is a field programmable gate array.

10. An apparatus comprising:
a computer processing arrangement for making a verification whether a target configuration image file is compatible with an electrical circuit, the electrical circuit comprising a programmable logic device (PLD), an embedded processor, external to and communicatively coupled with the PLD, at least one memory device, and at least one input/output (I/O) device, wherein making the verification comprises:
receiving a user selection of a target configuration image file;
receiving a first identifier, the first identifier comprising identification information of a first set of electrical circuit designs with which the target configuration image file is compatible; and
making a determination whether the electrical circuit has a design included in the first set by comparing the first identifier with a second identifier, the second identifier corresponding to a design definition of the electrical circuit.

11. The apparatus of claim 10, wherein one or both of the first identifier and the second identifier is a hashtag.

12. The apparatus of claim 10, wherein the electrical circuit includes the computer processing arrangement.

13. The apparatus of claim 10, wherein the embedded processor includes the computer processing arrangement.

14. The apparatus of claim 10, computer processing arrangement is further configured to download the target configuration image file onto the at least one memory device after receiving the user selection and before making the determination.

15. The apparatus of claim 10, wherein, when the determination is that the electrical circuit has a design included in the set of electrical circuit designs, programming the PLD with the target configuration image file.

16. The apparatus of claim 10, further comprising, when the determination is that the electrical circuit has a design not included in the set of electrical circuit designs, outputting an error message.

17. The apparatus of claim 10, wherein the PLD is a field programmable gate array.

18. A method for generating, with a computer assisted design tool, a configuration image file configured for programming one or more programmable logic devices (PLD's), the method comprising:

creating, with the computer assisted design tool, responsive to an input from a first user, a first identifier of a first set of electrical circuit designs with which the configuration image file is compatible, each electrical circuit design within the set being defined by parameters of (i) a respective PLD, (ii) an embedded processor external to and communicatively coupled with the respective PLD, (iii) at least one memory device external to the respective PLD, and (iv) at least one input/output (I/O) device; and making the first identifier, together with the configuration image file, available to a second party other than the first user.

19. The method of claim 18, wherein the identifier is a hashtag.

20. The method of claim 18, further comprising:

making the first identifier, together with the configuration image file, available to the second party by uploading the first identifier and the configuration image file to a database accessible to a developer of the electrical circuit.

\* \* \* \* \*